(12) United States Patent
Simon et al.

(10) Patent No.: US 7,098,053 B2
(45) Date of Patent: Aug. 29, 2006

(54) METHOD OF PRODUCING SEMICONDUCTOR ELEMENTS USING A TEST STRUCTURE

(75) Inventors: Paul Leon Cecile Simon, Revel (FR); Aalt Marco Van De Pol, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/539,103

(22) PCT Filed: Dec. 5, 2003

(86) PCT No.: PCT/IB03/05763

§ 371 (c)(1),
(2), (4) Date: Jun. 15, 2005

(87) PCT Pub. No.: WO2004/057672

PCT Pub. Date: Jul. 8, 2004

(65) Prior Publication Data

US 2006/0121631 A1 Jun. 8, 2006

(30) Foreign Application Priority Data

Dec. 20, 2002 (EP) .................................. 02080535

(51) Int. Cl.
*H01L 21/66* (2006.01)
*G01R 31/26* (2006.01)

(52) U.S. Cl. ................................. 438/18; 257/E21.524

(58) Field of Classification Search ................. 438/6, 438/14, 17, 18; 257/E21.524; 324/718, 324/719
See application file for complete search history.

(56) References Cited

U.S. PATENT DOCUMENTS

| 4,800,418 | A | 1/1989 | Natsui |
| 6,054,721 | A | 4/2000 | Milor |
| 6,714,031 | B1 * | 3/2004 | Seki ........................... 324/763 |
| 6,831,294 | B1 * | 12/2004 | Nishimura et al. ............ 257/48 |
| 2003/0022401 | A1 * | 1/2003 | Hamamatsu et al. .......... 438/14 |
| 2003/0162310 | A1 * | 8/2003 | Nakatuka et al. ............. 438/14 |

\* cited by examiner

*Primary Examiner*—W. David Coleman
(74) *Attorney, Agent, or Firm*—Peter Zawilski

(57) ABSTRACT

Testing the production of semiconductor elements on a substrate, the semiconductor elements having a plurality of cell types, by providing at least one test structure on the substrate with a number of test cells having cell types similar to one or more of the plurality of cell types, each of the cell types having at least a first and a second local interconnect layer structure to be connected to predetermined supply voltages during use, a plurality of first and second polysilicon layer structures to provide control voltages to first and second electronic component structures, respectively, connecting in the test structure all of the plurality of first polysilicon layer structures to one another to provide an interconnected first polysilicon layer structure, and connecting in the test structure all of the plurality of second polysilicon layer structures to one another to provide an interconnected second polysilicon layer structure, providing predetermined test voltages and measuring currents resulting from the test voltages to identify production errors.

7 Claims, 5 Drawing Sheets

METHOD OF PRODUCING SEMICONDUCTOR ELEMENTS USING A TEST STRUCTURE

The present invention relates to the testing of the production of at least one semiconductor element in a semiconductor substrate.

U.S. Pat. No. 6,054,721 discloses a method of producing semiconductor elements on a semiconductor wafer using a predetermined test structure that is produced on the same semiconductor wafer during the fabrication of the semiconductor elements. In order to detect undesired connections between conductive structures within the multiple layers on the semiconductor wafer, the prior art discloses a method of producing finger shaped layers in the test structure comprising conductive layers having the same distances and orientations with respect to one another as in the semiconductor elements to be produced. The conductive layers in the test structure are designed such that they can be easily connected to a test arrangement for supplying voltages to the conductive layer, in order to test undesired shorts between them. If the test structure shows an undesired electrical short, most probably the semiconductor elements on the same semiconductor wafer will also show similar undesired shorts.

In nowadays 0.18 micron technology (and smaller), the test structure provided by this prior art document is not sufficient anymore. There is a need for an improved method of detecting defects during production of CMOS 0.18 micron technology (and smaller).

Therefore, the invention provides a method of producing at least one semiconductor element in a semiconductor substrate, the semiconductor element having a plurality of cell types, the method comprising:

producing at least one test structure on the semiconductor substrate, comprising a predetermined number of test cells having cell types similar to one or more of the plurality of cell types each of the cell types having at least a first and second local interconnect layer structure to be connected to predetermined supply voltages during use, a plurality of first and second polysilicon layer structures to provide control voltages to first and second electronic component structures, respectively, connecting in the test structure all of the plurality of first polysilicon layer structures to one another to provide an interconnected first polysilicon layer structure, and connecting in the test structure all of the plurality of second polysilicon layer structures to one another to provide an interconnected second polysilicon layer structure;

providing predetermined test voltages to the first and second local interconnect layer structures, and to the interconnected first and second polysilicon layer structures, respectively;

measuring currents resulting from the test voltages to identify production errors.

By interconnecting all of the first polysilicon layer structures to one another and interconnecting all the second polysilicon layer structures in the test structure to one another there are basically four different conductive structures in the test structure. By then providing different voltages of a predetermined value between those four conductive structures, several kinds of potential electric shorts or leakage currents can be easily established. If the test structure shows such undesired shorts or leakage currents, it may be assumed that the semiconductor elements show these kinds of defects too.

Preferably, the test voltages are selected such that at least one of the following production errors may be determined:

one or more electric shorts between the first and the second polysilicon layer structures;

one or more electric shorts between at least one of the first and second local interconnect layer structures and at least one of the first and second polysilicon layer structures;

n-gate oxide leakages;

p-gate oxide leakages.

The present invention also relates to a semiconductor substrate comprising at least one semiconductor element, the semiconductor element having a plurality of cell types, and at least one test structure comprising a predetermined number of test cells having cell types similar to one or more of the plurality of cell types, each of the cell types having at least a first and a second local interconnect layer structure to be connected to predetermined supply voltages during use, a plurality of first and second polysilicon layer structures to provide control voltages to first and a second electronic component structures, respectively, in the test structure all of the plurality of first polysilicon layer structures being connected to one another to provide an interconnected first polysilicon layer structure, and in the test structure all of the plurality of second polysilicon layer structures being connected to one another to provide an interconnected second polysilicon layer structure.

Finally, the present invention relates to a semiconductor device comprising such a substrate.

The present invention will be illustrated with reference to some drawings which are only intended to explain the present invention but not to limit its scope, which is limited only by the scope of the annexed claims.

FIG. 5b shows schematically a top view of a four-transistor cell in the YEM structure used for testing the four-transistor structure of FIG. 5a;

FIG. 1 shows very schematically a circular wafer 1 made of a semiconductor material, e.g., silicon or any other applicable semiconductor material known to persons skilled in the art. The wafer is, e.g., 200 mm in diameter.

During the production of semiconductor elements on the wafer 1, a plurality of reticles 2 are produced on the wafer 1. There are, e.g., 50 such reticles 2. The reticles 2, as is known to persons skilled in the art, may have the form of a square. Every reticle 2 comprises the same semiconductor elements. Following the production of the semiconductor elements, the reticles 2 are separated from one another by sawing, as is known to persons skilled in the art.

Figure 1:
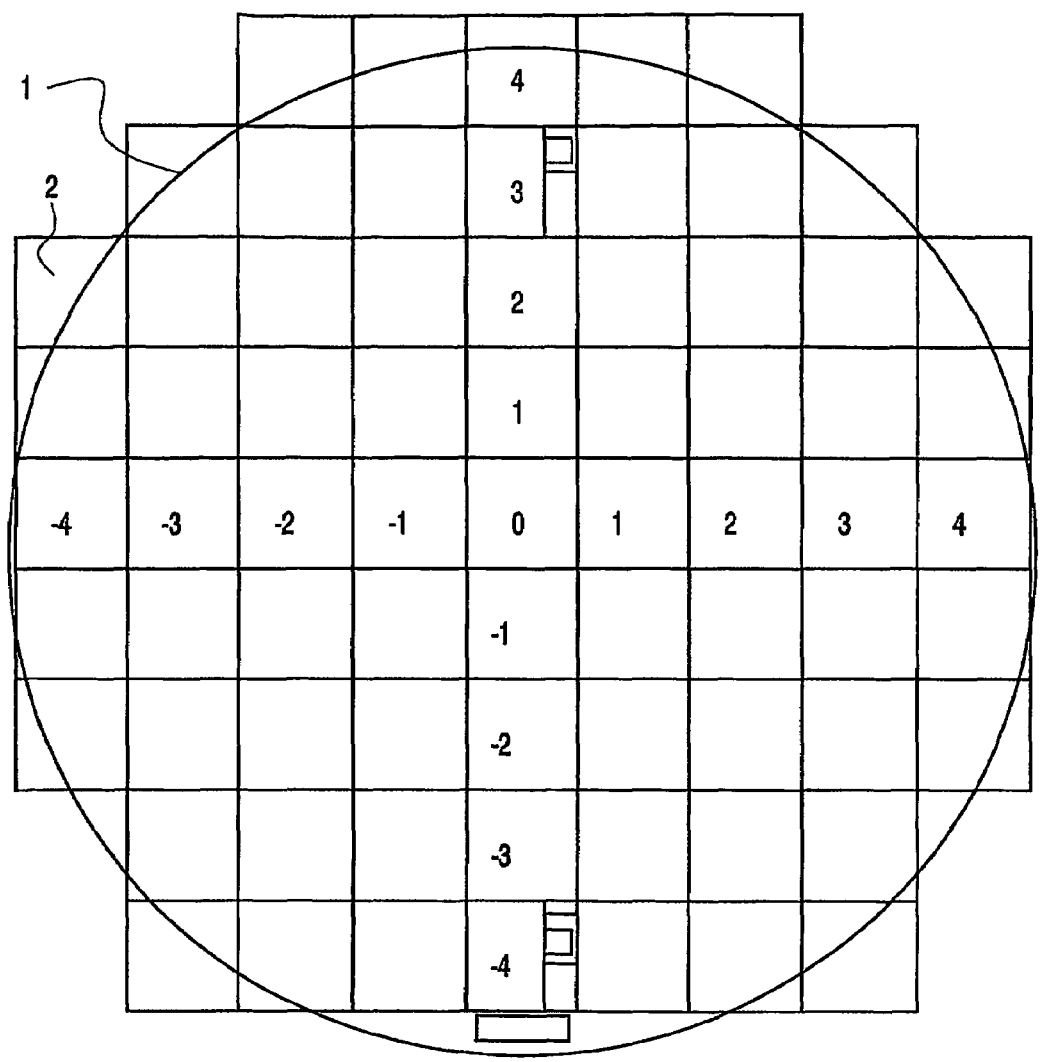
FIG. 1 shows schematically a wafer and a plurality of reticles on the wafer during production of semiconductor elements.
Figure 2:
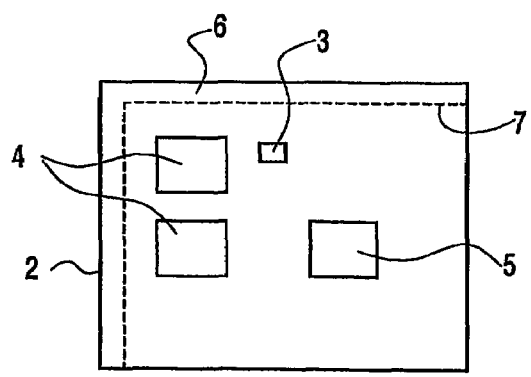
FIG. 2 shows schematically one of the reticles of FIG. 1.

FIG. 2 shows an example of a reticle 2. The reticle 2 comprises a plurality of semiconductor elements 4. FIG. 2 shows two such semiconductor elements 4, however, there may be many more of such semiconductor elements 4. A saw line 7 shows where the reticle 2 will be separated from its neighbours.

As is known to a person skilled in the art, the area 6 where the reticle 2 is separated from its neighbours, may be provided with very small product characterisation modules PCM. These PCMs comprise test structures providing a limited possibility of characterising the process to produce the semiconductor elements 4.

The reticle 2 may also comprise one or more process evaluation modules PEM 3. Such PEMs 3 are also known from the prior art and are used to measure process parameters as well as the data used for process development.

The reticle 2 also comprises at least one yield evaluation module YEM 5. Also YEMs are known from the prior art and are used for purposes of yield verification. A limited number of these YEMs is available in view of the limited reticle surface of, e.g., 4 cm$^2$.

The present invention relates to a modified YEM structure used for testing.

Figure 3:
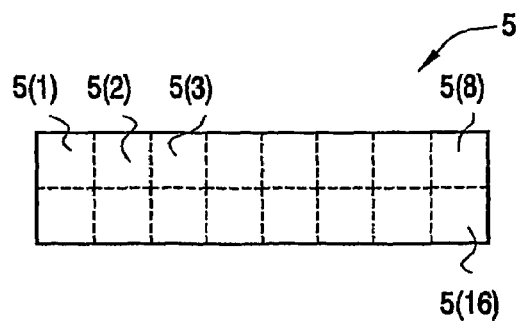
FIG. 3 shows schematically a block diagram of a test structure.

FIG. 3 shows how the YEM 5 may be designed in accordance with the invention. The YEM 5, e.g., comprises 16 different cell structures 5(1), . . . 5(16). Each of the cells 5(i), i=1, . . . 16, comprises a plurality of semiconductor elements with a similar structure as the semiconductor elements 4 to be tested. FIG. 3 shows that these cells 5(i) are arranged in 8 columns and 2 rows. However, there may be provided other numbers of cells in other arrangements.

It has been found that, in most cases, a limited number of cells (e.g. 16 as in the example of FIG. 3) may already be representative of a very large number of the electrical components in the semiconductor elements 4. For instance, the table below shows that 16 cells with the highest number of electrical components in a DSP block (DSP=Digital Signal Processing) in the semiconductor elements 4 may cover about 70% of the total area covered by the DSP block in the semiconductor element 4. Therefore, designing the YEM 5 with 16 cells with similar electronic components as in the semiconductor element 4 results in a test structure representative of the majority of electronic components in the semiconductor elements 4.

| | Cell | # | function |
|---|---|---|---|
| 1 | nd2 | 3508 | input NAND |
| 2 | rdmr_fd1sqx2 | 2290 | flip flop |
| 3 | Iv | 2057 | inverter |
| 4 | Ao2 | 1777 | input BOOLEAN |
| 5 | Ao3a | 1207 | input BOOLEAN |
| 6 | gate_decap9 | 1158 | decoupling cell |
| 7 | mux21 | 1021 | input MUX |
| 8 | Nd3 | 927 | input NAND |
| 9 | Nr2 | 905 | input NOR |
| 10 | Nd2a | 575 | input NAND |
| 11 | Ao7a | 551 | input BOOLEAN |
| 12 | En2 | 479 | input OBSOLETE |
| 13 | Ao2n | 448 | input BOOLEAN |
| 14 | Bfltx2 | 428 | plain BUFFER |
| 15 | a06 | 344 | input BOOLEAN |
| 16 | Eo2 | 332 | input OBSOLETE |
| | Eo2 | | |
| | total added area | 0.462 mm2 | |
| | total area dsp | 0.666 mm2 | |
| | covered | 69.4% | |

Figure 4:
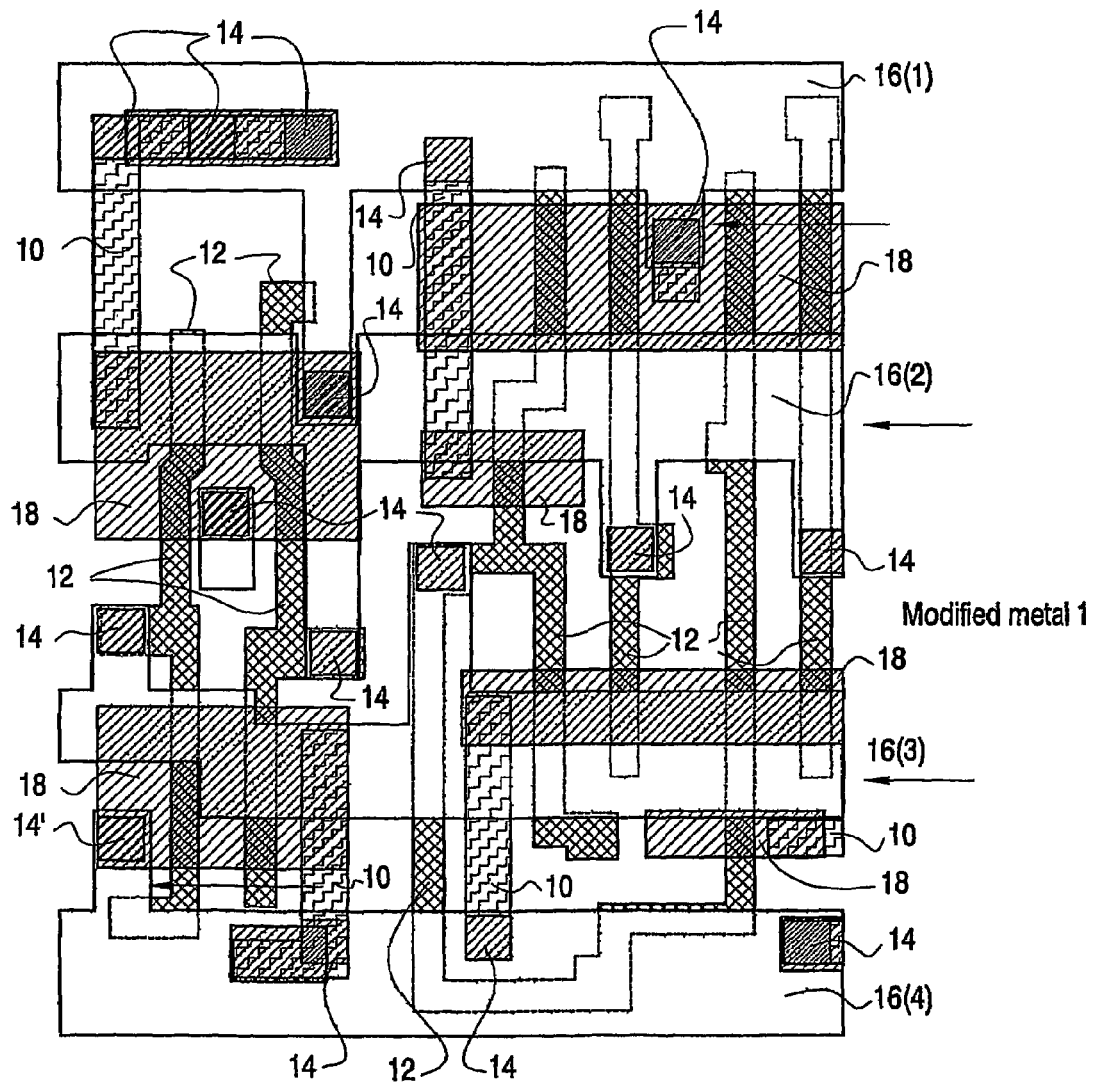
FIG. 4 shows schematically a top view of a portion of a YEM cell in the test structure.

FIG. 4 shows a top view of an exemplary YEM cell portion in accordance with the invention. The YEM structure comprises a plurality of electrical components that are interconnected in a predetermined way in order to be able to perform the desired electrical tests.

FIG. 4 shows four metal lines/connections 16(1), 16(2), 16(3), 16(4) of the same metal layer on top of the cell structure. Below the metal lines 16(1) . . . 16(4), there are provided several local interconnection layer (LIL) structures 10. Usually these local interconnection layers are made of polysilicon, polysilicon having a silicide layer on top of it, or metal, as is known to a person skilled in the art.

In a layer below the metal lines 16(1), . . . 16(4), there are provided polysilicon layers 12, usually, to connect gates of transistors to control voltages to control the operation of the transistors. In the present structure, there are at least 2 sets of different polysilicon layers where portions of one set are not allowed to show electrical shorts to portions of the other set.

The test structure also comprises source and drain regions 18.

Electrical contacts between the metal lines 16(1), . . . 16(4) and underlying polysilicon layers 12 and LIL 10 are indicated with reference numbers 14.

The structure of the YEM cell is similar to, but not equal to, the associated cell structures used in the semiconductor elements 4. This will be further explained with reference to FIGS. 5a and 5b. In accordance with the invention, in the YEM structure, the polysilicon structure 12, the LIL structure 10, as well as the source and drain 18 are equal to the respective same areas in the original electrical components in the semiconductor elements 4. Only the metal lines 16(1), . . . 16(4) and their connections to the underlying structures have been amended to provide for an easy test environment.

Figure 5A:
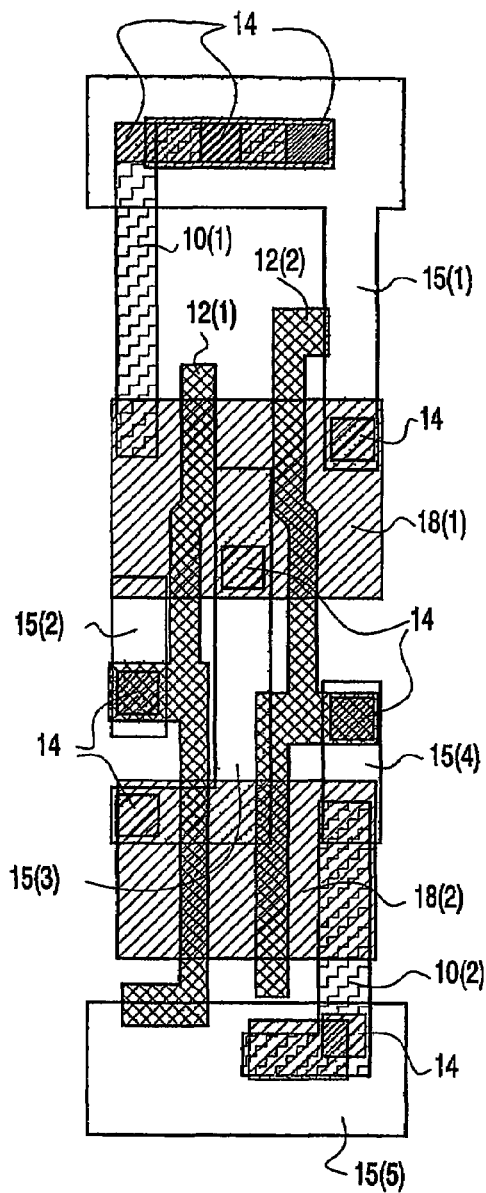
FIG. 5a shows schematically a top view of a four-transistor construction in the semiconductor element to be tested.
Figure 5B:
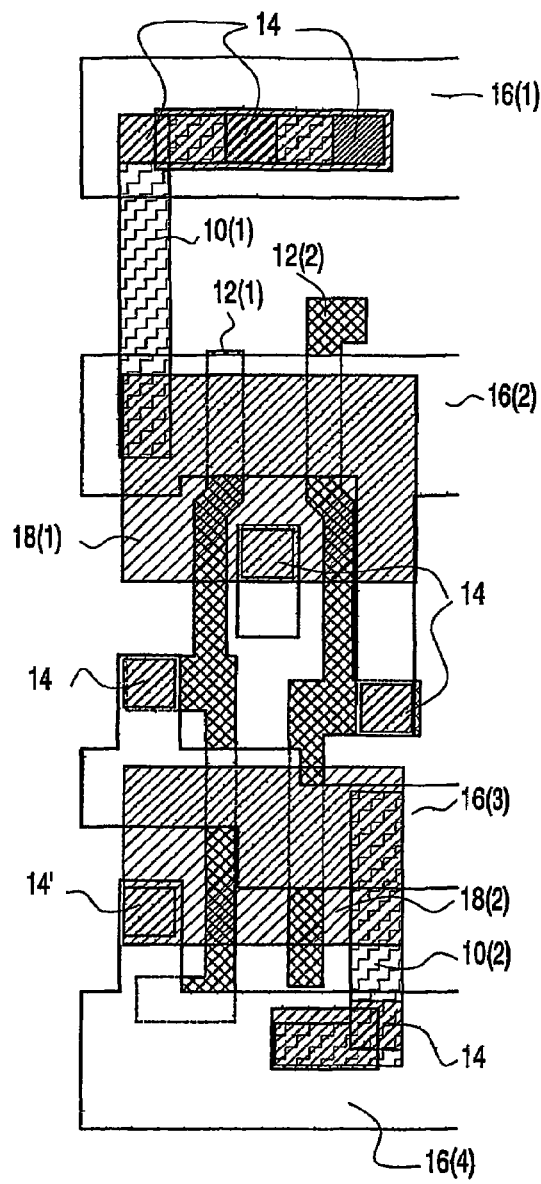

FIG. 5a shows an original four-transistor cell of a semiconductor element 4. FIG. 5b shows a portion of FIG. 4 on an enlarged scale and reflects how the original structure of FIG. 5a is modified in the YEM cell. The same reference numbers as in FIG. 4 refer to the same areas. So, FIG. 5a shows a structure of which potential production errors will be identified not by testing the structure of FIG. 5a itself but by testing the structure of 5b that has been changed relative to FIG. 5a as is further explained below. FIG. 5a shows that the original structure comprises other metal lines, here referenced 15(1), . . . 15(5), than the modified structure of FIG. 5b. E.g., in FIG. 5a, metal line 15(5) is connected to a LIL 10(2) (and normally also to ground), whereas in FIG. 5b, the corresponding metal line 16(4) is additionally connected to a drain of one of the transistors. Also the other metal lines 15(1), . . . 15(4) have other areas and connections than corresponding metal lines 16(1), . . . 16(3) in FIG. 5b. E.g., metal line 15(1) in FIG. 5a is connected both to a LIL 10(1) and a source/drain area 18 whereas in FIG. 5b, metal line 16(1) is only connected to the LIL 10(1).

The metal line 16(1) is to be connected to a first power supply voltage, whereas the metal line 16(4) is to be connected to a second power supply voltage.

FIGS. 5a and 5b show that in the four-transistor cell arrangement there are two different polysilicon lines 12(1), 12(2). Regions 18(1) and 18(2) define source and drain regions for the four transistors.

Metal line 16(2) is used to interconnect all polysilicon layer structures 12(2) in the entire cell, and the metal line 16(3) is used to interconnect all polysilicon layer structures 12(1) in the entire cell.

Figure 6A:
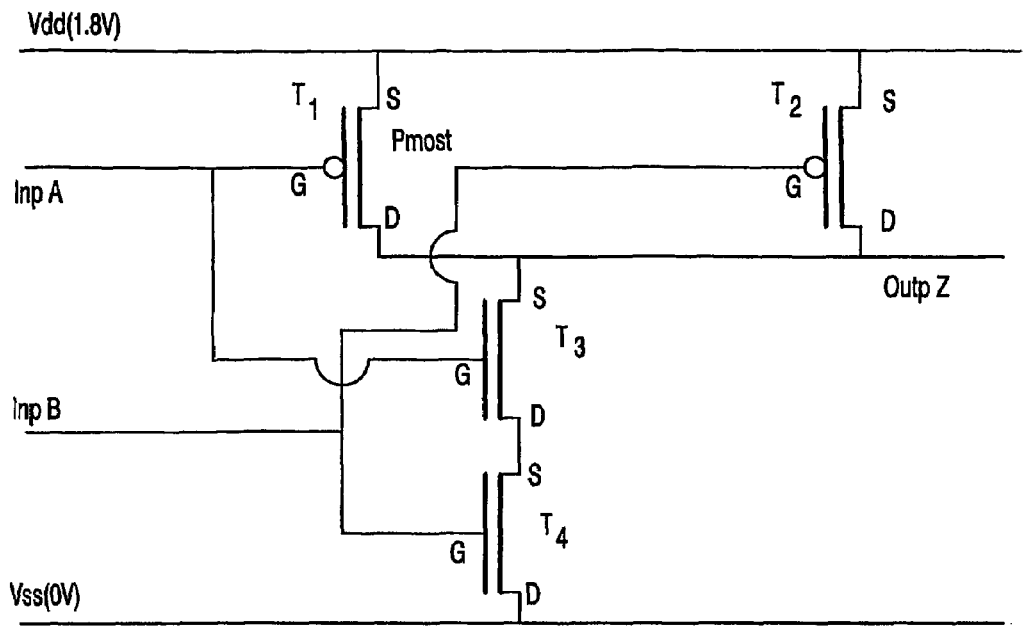
FIGS. 6a and 6b show equivalent electric circuits of the structures shown in FIGS. 5a and 5b, respectively.

FIG. 6a shows an equivalent electronic circuit of the structure shown in FIG. 5a. It comprises four transistors T1, T2, T3, T4. All the transistors are MOS transistors. Transistors T1 and T2 are PMOS transistors, whereas transistors T3 and T4 are NMOST transistors. The transistors T1, T2 have sources connected to a power supply line Vdd, e.g., 1.8V. The drains of the transistors T1, T2 are connected to one another and provide an output Outp Z.

The drains of the transistors T1, T2 are also connected to a source of transistor T3. Transistor T3 has its drain D connected to source S of transistor T4. Transistor T4 has its drain D connected to power supply voltage Vss, e.g., being on ground level 0V.

Transistors T1, T3 have gates connected to a common input line Inp A. Transistors T2, T4 have gates connected to an input line Inp B.

Figure 6B:
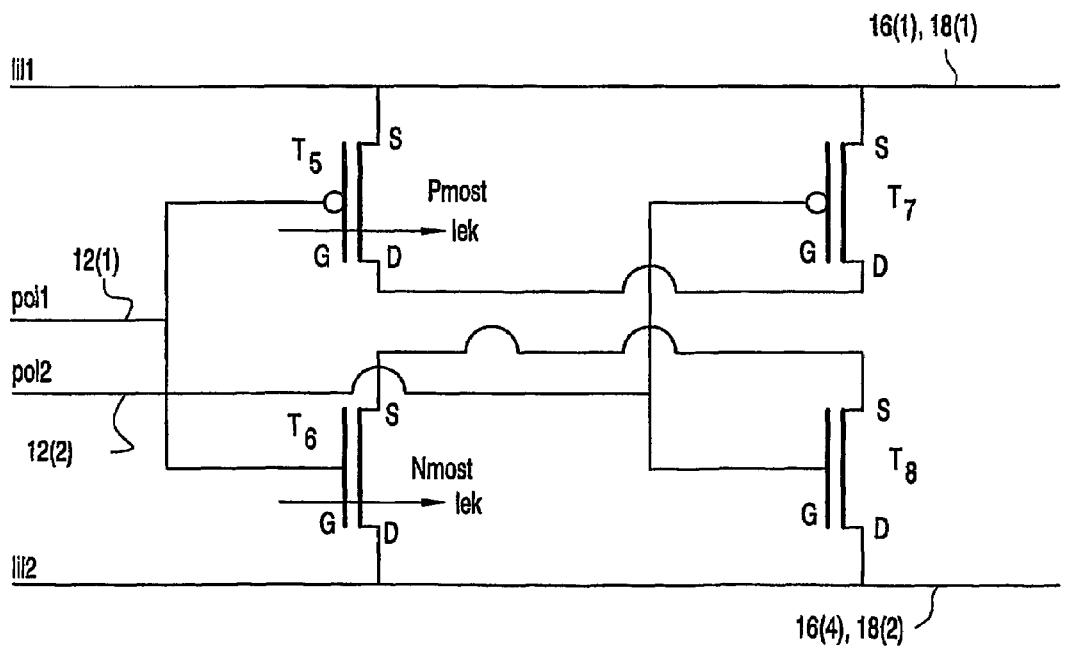

FIG. 6b shows an equivalence circuit of the structure shown in FIG. 5b. It also shows a four transistor cell, however, arranged in a slightly different way than the structure of FIG. 6a. FIG. 6b shows that the four-transistor cell is arranged as two CMOS structures. Transistors T5, T6 are arranged as a first CMOS structure having their gates jointly connected to the polysilicon line 12(1), also indicated in FIG. 6b with "pol1".

Transistors T7, T8 are arranged as a second CMOS structure having their gates connected to a second polysilicon line 12(2), in FIG. 6b also indicated with "pol2".

Moreover FIG. 6b shows how the areas 16(1), 16(4), 18(1), 18(2) correspond to electrical connections of the equivalent electronic circuit.

Although the equivalent electronic circuit of FIG. 6b differs from the electronic circuit of the electronic components in the semiconductor elements 4, as shown in FIG. 6a, the basic structures of LIL 10, polysilicon 12, and source and drain regions 18 do have the same relative locations in the YEM structure. Only the way they are interconnected in the YEM structure by the metal lines 16(1), . . . 16(4) differs such that an easy test measurement can be performed.

The arrangement of FIG. 5b allows for instance to make the following test measurements in the YEM structure, as indicated in the table below.

|  | pol1 [V] | pol2 [V] | lil1 [V] | lil2 [V] |
| --- | --- | --- | --- | --- |
| polpol shorts | 0 | 1.8 | 1.8 | 0 |
| polLIL shorts | 0 | 0 | 1.8 | 1.8 |
| Nmost leakage | 1.8 | 1.8 | 1.8 | 0 |
| Pmost leakage | 0 | 0 | 1.8 | 0 |

Where:

polpol shorts=electrical shorts between pol1 and pol2 structures in the YEM structure;

polLIL shorts=electrical shorts between one or more of the pol1 and pol2 structures and one or more of the LIL and LIL1 and LIL2 structures (cf. FIG. 6b);

Nmost leakage=leakage currents through the Nmost T6, T8 (cf. FIG. 6b);

Pmost leakage=leakage currents in Pmost T5, T7 (cf. FIG. 6b).

After applying the voltages as indicated in the table above, no currents may be detected when the structures are located correctly. If currents (above a predetermined threshold level) are detected, one or more of the errors indicated above are present. If these errors are present in the YEM structure, one can conclude that, most probably, similar defects are present in the semiconductor elements 4 in the same reticle 2.

Figure 7:
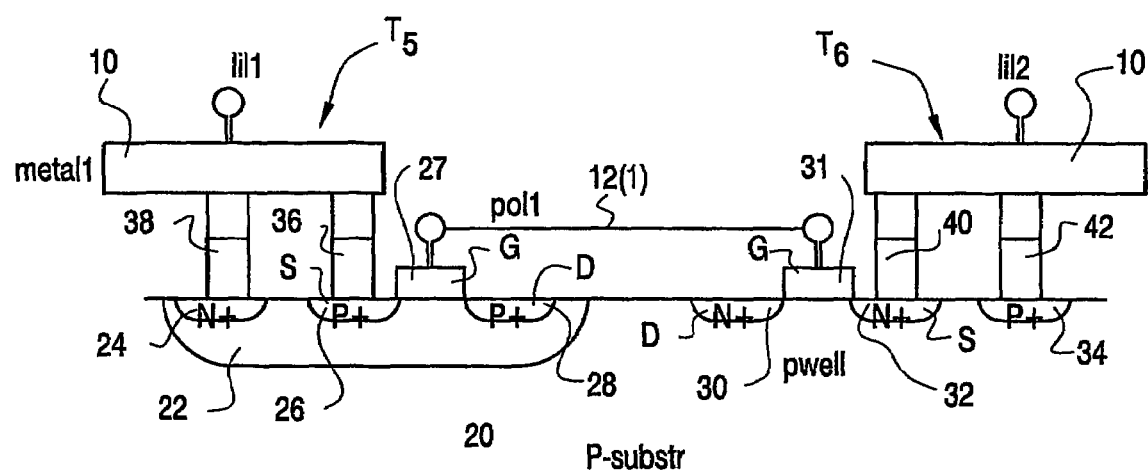
FIG. 7 shows a schematic lateral section of two transistors of the equivalent circuit of FIG. 6b.

FIG. 7, finally, shows a schematic lateral view of transistors T5 and T6 of the circuit shown in FIGS. 5b and 6b. The transistor T5 is connected with its source 26 to lil1 line 10 via a contact 36. Transistor T5 comprises a gate 27 separated from an Nwell 22 by means of an insulating layer (not shown). Transistor T5 comprises a drain 28.

Transistor T5 also comprises an N+ region 24 connected to lil1 line 10 via a contact 38 for providing the Nwell 22 with an appropriate bias voltage.

Transistor T6 is arranged directly in a P substrate 20 and is provided with a drain 30, a source 32 and a gate 31. The source 32 is connected to lil2 line 10 via a contact 40. Transistor T6 comprises a P+ region 34 connected to lil2 line 10 via a contact 42 for providing the substrate with a proper bias voltage.

The gates 27, 31 of the transistors T5, T6 are interconnected by polysilicon line 12(1) (pol1).

Although the present invention has been illustrated with reference to a four-transistor structure (FIGS. 5a and FIGS. 5b), and especially with a CMOS structure as a test structure (FIGS. 5b and 6b), the present invention is not limited to these types of electrical components in the cell structures. Other cell types and electrical components in the semiconductor elements 4 and in the YEM structure may be provided.

Moreover, the present invention is in no way limited to the doping types given in, e.g., FIG. 7. Other dopings may be provided, if necessary.

The invention claimed is:

1. Method of producing at least one semiconductor element in a semiconductor substrate, the semiconductor element having a plurality of cell types, the method comprising:
   producing at least one test structure on said semiconductor substrate, comprising a predetermined number of test cells having cell types similar to one or more of said plurality of cell types;
   each of said cell types having at least a first and a second local interconnect layer structure to be connected to predetermined supply voltages during use, a plurality of first and second polysilicon layer structures to provide control voltages to first and second electronic component structures, respectively;
   connecting in said test structure all of said plurality of said first polysilicon layer structures to one another to provide an interconnected first polysilicon layer structure, and connecting in said test structure all of said plurality of said second polysilicon layer structures to one another to provide an interconnected second polysilicon layer structure;
   providing predetermined test voltages to said first and second local interconnect layer structures, and to said interconnected first and second polysilicon layer structures, respectively;
   measuring currents resulting from said test voltages to identify production errors.

2. Method according to claim 1, wherein said plurality of said first and second polysilicon layer structures are connected to one another using metal connection structures.

3. Method according to claim 1, wherein said test structure comprises CMOS transistors.

4. Method according to claim 1, wherein said test voltages are selected such that at least one of the following production errors may be determined:
   one or more electrical shorts between said first and second polysilicon layer structures;
   one or more electrical shorts between at least one of said first and second local interconnect layer structures and at least one of said first and second polysilicon layer structures;
   n-gate oxide leakages;
   p-gate oxide leakages.

5. Method according to claim 1, wherein said at least one semiconductor element is located in one of a plurality of reticles on a semiconductor wafer.

6. A semiconductor substrate comprising at least one semiconductor element,
- the semiconductor element having a plurality of cell types, and
- at least one test structure comprising
    - a predetermined number of test cells having cell types similar to one or more of said plurality of cell types,
    - each of said cell types having at least a first and a second local interconnect layer structure to be connected to predetermined supply voltages during use,
    - a plurality of first and second polysilicon layer structures to provide control voltages to first and second electronic component structures, respectively, in said test structure all of said plurality of said first polysilicon layer structures being connected to one another to provide an interconnected first polysilicon layer structure, and
    - in said test structure all of said plurality of said second polysilicon layer structures being connected to one another to provide an interconnected second polysilicon layer structure.

7. A semiconductor device comprising a substrate according to claim 6.

* * * * *